United States Patent [19]

Carlson et al.

[11] Patent Number: 4,536,379

[45] Date of Patent: Aug. 20, 1985

[54] PRODUCTION OF SILICON CARBIDE

[75] Inventors: Walter H. Carlson, Aurora; Gerald B. Zander, North Olmsted; George C. Hanna, Chagrin Falls; Kevin L. Burmeister, Kent, all of Ohio

[73] Assignee: Graphite Sales, Inc., Chagrin Falls, Ohio

[21] Appl. No.: 500,522

[22] Filed: Jun. 2, 1983

[51] Int. Cl.$^3$ .............................................. C01B 31/36
[52] U.S. Cl. ..................................................... 423/345
[58] Field of Search .......................................... 423/345

[56] References Cited

U.S. PATENT DOCUMENTS

| | | | |
|---|---|---|---|
| 2,854,364 | 9/1958 | Lely | 148/1.5 |
| 3,161,473 | 12/1964 | Pultz | 23/208 |
| 3,166,380 | 1/1965 | Kuhn | 23/208 |
| 3,175,884 | 3/1965 | Kuhn | 23/208 |
| 3,232,706 | 2/1966 | Kuhn | 23/191 |
| 3,246,950 | 4/1966 | Gruber | 23/208 |
| 3,271,109 | 9/1966 | Mezey et al. | 423/345 |
| 3,519,472 | 7/1970 | Dyne et al. | 117/106 |
| 3,692,478 | 9/1972 | Knippenberg et al. | 423/345 |
| 3,920,446 | 11/1975 | Irani | 423/345 X |
| 3,933,984 | 1/1976 | Kimura et al. | 423/345 |
| 4,248,844 | 2/1981 | Ramsey et al. | 423/345 |
| 4,284,612 | 8/1981 | Horne et al. | 423/345 |

OTHER PUBLICATIONS

June-Gunn Lee et al., Am. Ceram. Soc. Bull. (USA), vol. 54, No. 2, pp. 195-198, (1975).

*Primary Examiner*—G. L. Kaplan
*Attorney, Agent, or Firm*—Body, Vickers & Daniels

[57] ABSTRACT

A process for the manufacture of silicon carbide crystals and whiskers comprises reacting at a temperature between 1,400° C. and 2,100° C. and in the presence of an inert gas, a material including as essential ingredients carbon, alumina, iron oxide, potassium oxide, and silica in an amount to provide a carbon to silicon ratio of from about 0.84:1 to about 2.17:1.

19 Claims, No Drawings

PRODUCTION OF SILICON CARBIDE

BACKGROUND OF THE INVENTION

This invention relates to the art of producing silicon carbide and, more particularly, to improvements in the production of silicon carbide in the form of crystals and whiskers.

It is of course well known that silicon carbide occurs in two crystal forms, one of which is particulate in nature and the other of which is in the form of elongated crystal fibers known as whiskers and which generally have a diameter of a few microns and a length of several millimeters. The particulate form, referred to hereinafter as silicon carbide crystals, is of value as an abrasive material, and silicon carbide whiskers have high stiffness and tensile strength as well as thermal stability which render the whiskers of considerable value as a reinforcing material for incorporation into metals and plastics. Many processes using a variety of materials have been proposed heretofore for producing silicon carbide whiskers and/or silicon carbide crystals. However, in connection with the production of silicon carbide whiskers in particular, either the high cost of processing equipment and/or the materials to be processed and/or the low yield of whiskers from such materials have resulted in the cost of producing whiskers being extremely high, whereby the availability of the advantages thereof to industry has been undesirably limited.

SUMMARY OF THE INVENTION

The present invention provides for the production of silicon carbide crystals and whiskers through the use of a relatively inexpensive mined material which, for producing crystals and whiskers in accordance with the invention, includes as essential ingredients carbon, silica alumina, iron oxide and potassium oxide, and which material either alone or together with additional silica and/or carbon provides a carbon to silicon ratio in a given quantity processed of from about 0.84:1 to about 2.17:1. Silicon carbide crystals and whiskers are produced according to the present invention by reacting the material in a furnace at a temperature of from about 1,400° C. to about 2,100° C. in the presence of an inert gas.

The mined material mentioned above is referred to hereinafter as Black Diamond and is available from a mine by the same name in Townsend, Mont. The approximate composition of Black Diamond, typically as mined and by weight, is about 3.0% moisture, about 33.9% fixed carbon, about 8.0% volatiles, and about 56% ash. The approximate mineral analysis of the ash, based on the total weight thereof, is about 76.8% silica, about 12.9% alumina, about 4.6% iron oxide, about 2.4% potassium oxide and trace amounts of magnesia, lime, titanium oxide, sodium oxide, sulfur trioxide, potassium pentoxide, and unknowns. While the latter composition is typical, the fixed carbon content of the mined material varies from about 12% to about 50%, with the moisture and volatiles content remaining about the same, whereby the ash content varies from about 39% to about 77%. The proportions of the materials in the ash content also remain about the same.

The typical composition set forth above for Black Diamond as mined has a carbon to silica ratio of about 1.57:1. Through experimentation in connection with the production of silicon carbide crystals and whiskers according to the invention, it has been found that Black Diamond which, as mined or as modified by the addition of carbon and/or silica, has a carbon to silicon ratio of from about 0.84:1 to about 2.17:1 provides a good yield of silicon carbide crystals and whiskers, and that the best yields are realized with a carbon to silicon ratio of from about 0.84:1 to about 1.57:1. It will be appeciated of course that the typical composition of Black Diamond as mined can be modified by the addition of silica thereto so as to provide a carbon to silicon ratio within the preferred range, and it will likewise be appreciated that the mined material varying in carbon content from the typical composition can be modified by appropriate additions of carbon or silica to provide a carbon to silicon ratio within either the broad or the preferred range. Any suitable carbon or silica can be employed for the additions referred to above, one such source for carbon being graphite in the form of dust collector fines which is theoretically 100% carbon. Suitable sources of silica include a product of the Ferro Alloy Division of Interlake Company of Beverly, Ohio known as $SiO_2$ Fumes, and Ohio Sands which is a fine grain sand obtained from the Ohio Mines in Radesburg, Mont.

As will become apparent from the examples set forth hereinafter, silicon carbide crystals and whiskers are produced according to the present invention using the typical Black Diamond composition referred to above as the basis for establishing the carbon to silicon ratios of from 0.840:1 to 2.17:1. The typical composition of Black Diamond is used as a basis in the examples because of its predominance with respect to the composition of the mined material. However, as will be understood from the reference hereinabove to the variation in carbon and ash content in the mined material, Black Diamond which, as mined, varies in composition from the typical can provide the desired carbon to silicon ratio, can be modified by the addition of carbon or silica to provide the desired ratio, or can be modified to provide the typical composition.

Further in accordance with the invention, the materials to be processed can either be in the form of powder or pellets made from such powder and, preferably ranging in size from 1/16 in. to ½ in. in diameter, or in granules or particles of the same size when the mined Black Diamond is processed alone. In connection with the production of pellets, the latter are produced by providing the ingredients of the formulations in powder form, mixing the ingredients to assure uniform dispersement thereof in the composition, adding water to facilitate forming the powder into the desired pellet sizes, and allowing the formed pellets to dry at room temperature prior to use. In connection with the preparation of pellets with respect to the combination of mined Black Diamond and additional silica, the silica provides a binder for the ingredients, and the $SiO_2$ Fumes and Ohio Sands referred to above are preferred sources of silica primarily for their good binding characteristics. However, it will be appreciated that other silica sources can be used and, if necessary, or if desired either in connection with the use of $SiO_2$ Fumes and Ohio Sands, or other silica sources, a separate binder such as carboxyl methyl cellulose for example can be used.

DESCRIPTION OF THE INVENTION

As mentioned hereinabove, silicon carbide crystals and whiskers are produced in accordance with the present invention by reacting the compositions according to the invention in a furnace at a temperature of from about 1,400° C. to about 2,100° C. in the presence of an inert gas. In connection with the specific examples set forth below, the compositions were processed through a 2 in. diameter resistance heated Harper Electric Tube Furnace. The best results with respect to yield, and which are reflected in the examples, were achieved with the tube furnace preheated to a temperature between about 1,800° C. to 2,000° C. and with the inert gas, preferably argon or nitrogen, flowed through the furnace at a volume of from 5 to 10 cubic feet per hour. The furnace has input and discharge ends, and the materials to be treated are advanced through the furnace from the input to the discharge end in open top graphite receptacles containing about 100 to 150 grams of the material being processed. With this particular furnace, the through put rate is fixed and provides an advancement of the receptacles at a rate of ½ in. per minute to provide a process time of about 228 minutes. In the examples, the percentage of yield is based on the reaction of silica and carbon in accordance with the formula $SiO_2 + 3C \rightarrow SiC + 2CO$ the theoretical yield of 43% based on the total weight of the silica and carbon. For example, ten pounds of silica and carbon theoretically will produce 4.3 pounds of silicon carbide crystals and whiskers. Accordingly, an indication in the examples of a yield of 80% would, in connection with the theoretical example above, indicate a yield of 80% of 4.3 pounds, or 3.44 pounds.

EXAMPLE I

Black Diamond, as mined, and having the typical composition set forth herein was ground to a fine powder and mixed with additional silica in the form of $SiO_2$ Fumes in the ratio of 1.5 parts Black Diamond to 1 part $SiO_2$ Fumes, providing a ratio of fixed carbon to silica in the total composition of 0.30:1 and a carbon to silicon ratio for the total composition of 1.06:1. This material, when processed through a tube furnace under the preferred conditions mentioned above and either in powdered or pelletized form, provided a yield of about 75% crystals and whiskers.

EXAMPLE II

The composition of Example I was seeded with fine silicon carbide powder to the extent of 1% of the latter based on the total weight of the Black Diamond and added silica and, when processed through the tube furnace under the preferred conditions and either in powdered or pelletized form, provided a yield of about 86% silicon carbide crystals and whiskers.

EXAMPLE III

Black Diamond as mined and having the typical composition was ground to powder form and mixed with additional silica in the form of $SiO_2$ Fumes and in the ratio of 3.08 parts of the Black Diamond to 1 part of the added silica. This mixture provides a ratio of fixed carbon to silica in the total composition of 0.44:1 and a carbon to silicon ratio for the total composition of 2.17:1 and, upon being processed through the tube furance under the preferred conditions and either in the powdered or pelletized form, provided a yield of about 30% silicon carbide crystals and whiskers.

EXAMPLE IV

Black Diamond as mined and having the typical composition is ground to powdered form and combined with additional silica in the form of $SiO_2$ Fumes and in the ratio of 1.2 parts Black Diamond to 1 part added silica, providing a fixed carbon to silica ratio in the total composition of 0.26:1 and a carbon to silicon ratio for the total composition of 0.84:1. This composition was processed through the tube furnace under the preferred conditions in both powdered and pelletized form and produced a yield of about 74% silicon carbide crystals and whiskers.

EXAMPLE V

The composition of Example IV was seeded with fine silicon carbide powder in the amount of 1% of the latter based on the total weight of the Black Diamond and silica. Upon being processed through the tube furnace under the preferred conditions and in both powdered and pelletized form, the composition produced a yield of about 74% silicon carbide crystals and whiskers.

EXAMPLE VI

Black Diamond as mined and having the typical composition was ground to powdered form and mixed with additional silica in the form of $SiO_2$ Fumes and in the ratio of 1.8 parts Black Diamond to 1 part added silica. This composition provides a fixed carbon to silica ratio in the total composition of 0.34:1 and a carbon to silicon ratio for the total composition of 1.26:1. The composition produced a yield of about 77% silicon carbide crystals and whiskers when processed through the tube furnace under the preferred conditions and in both powdered and pelletized form.

EXAMPLE VII

The composition of Example VI was seeded with 1% of a fine silicon carbide powder based on the total weight of the mined Black Diamond and added silica, and the seeded composition provided a yield of about 78% silicon carbide crystals and whiskers when processed through the tube furnace under the preferred conditions and in both powdered and pelletized form.

EXAMPLE VIII

Black Diamond, as mined and having the typical composition, is ground to provide particles ranging in size from 1/16 in. to ½ in. The Black Diamond material alone provides a carbon to silica ratio of about 0.77:1 and a carbon to silicon ratio of about 1.57:1. The Black Diamond material in such particle form was processed through the tube furnace under the preferred conditions, and provided a yield of about 75% silicon carbide crystals and whiskers.

EXAMPLE IX

Black Diamond, as mined and having the typical composition, was semi-ashed, providing a fixed carbon content of 15% in the semi-ashed material. The semi-ashed Black Diamond in powdered form was combined with graphite in the form of dust collector fines and with additional silica in the form of $SiO_2$ Fumes, and in the proportions of 23% semi-ashed Black Diamond, 23% dust collector fines, and 54% $SiO_2$ Fumes. This composition provides a carbon to silica ratio in the total composition of about 0.41:1 and a carbon to silicon ratio in the total composition of about 1.06:1. The composition was seeded with 1% fine silicon carbide powder based on the total weight of the Black Diamond and added carbon and silicon. When processed through the tube furnace under the preferred conditions and in both powdered and pelletized form, the composition provided a yield of about 81% silicon carbide crystals and whiskers.

As evidenced by the foregoing examples, the processing of compositions in accordance with the present invention provides a desirably high yield of silicon carbide crystals and whiskers based on the theoretical yield referred to hereinabove. In connection with the latter, it will be seen from the examples that the compositions set forth in Examples II and IX provide the best total yield of whiskers and crystals. The best yield with respect to the production of silicon carbide whiskers is provided by the compositions of Examples I and II, and the best yield with regard to crystals is provided by the compositions of Examples VI, VII and IX. It will be appreciated of course that the purity of the silicon carbide crystals and whiskers can be improved by removing impurities by heating and/or acid washing the crystals and whiskers. In this respect, for example, the crystals and whiskers can be heated to a temperature of about 950° C. and/or washed with hydrofluoric acid. Such heating and/or acid washing results in a loss of weight in the crystals and whiskers, and the lesser the loss of weight the better the purity of the end product. In connection with each of the examples set forth hereinabove, the crystals and whiskers were both heated and acid washed in the foregoing manner, and the compositions in Examples VI, VII and IX again provided the best purity with respect to crystals, and the compositions of Examples I and II provided the best purity with respect to the whiskers. More particularly in this respect, with respect to the silicon carbide crystals produced in accordance with Examples VI, VII and IX, a total weight loss of between 2.87% and 4.41% of the weight of the produced crystals resulted from both heating and acid washing and, with respect to the whiskers produced in accordance with Examples I and II, a total weight loss of from 16.03% to 21.10% of the total weight of the whiskers produced resulted from both heating and acid washing of the whiskers. Moreover, while the best purity for crystals is achieved with the compositions set forth in Examples VI, VII and IX, the purity of crystals produced with the compositions of Examples I, II and IV is relatively high in that a total weight loss of from 4.81% to 4.99% results from the heating and acid washing of the crystals produced thereby.

Having thus described the invention, it is claimed:

1. A process for the production of silicon carbide crystals and whiskers comprising reacting at a temperature of between about 1,400° C. to about 2,100° C. and in the presence of an inert gas, a mined material of nature referred to herein as Black Diamond having as essential ingredients, carbon, silica, aluminum, iron oxide, potassium oxide, volatiles and moisture wherein a typical composition based on weight, comprises about 3% moisture, about 33% carbon, about 8% volatiles, and about 56% ash, said ash including, based on the weight of the ash, about 76.8% silica, about 12.9% alumina, about 4.6% iron oxide, and about 2.4 potassium oxide, and said typical composition providing a carbon to silicon ratio of about 1.57:1.

2. The process according to claim 1, and reacting said material at a temperature of between about 1,800° C. and 2,100° C.

3. The process according to claim 2, and adding additional silica to a given quantity of said material of nature in an amount which together with said given quantity provides a carbon to silicon ratio of from about 0.84:1 to about 2.17:1 for the total composition.

4. The process according to claim 3, wherein said additional silica is in an amount to provide a carbon to silicon ratio of from about 0.84:1 to about 1.57:1 for said total composition.

5. The process according to claim 3, wherein said additional silica is in an amount to provide a carbon to silicon ratio of from about 1.06:1 to about 1.26:1 for said total composition.

6. The process according to claim 3, wherein said additional silica is in an amount to provide a carbon to silicon ratio of about 1.06:1 for said total composition.

7. The process according to claim 3, and seeding said total composition with silicon carbide in an amount of about 1% of the total weight of said total composition.

8. The process according to claim 7, wherein said additional silica is in an amount to provide a carbon to silicon ratio of from about 0.84:1 to about 1.26:1 for said total composition.

9. The process according to claim 1, wherein said reaction takes place in a stationary furnace having input and discharge ends and said process includes the steps of maintaining said furnace at a temperature of from about 1,800° C. to about 2,100° C., placing said material in an open top carbon receptacle, and advancing said receptacle through said furnace from said input to said discharge end.

10. The process according to claim 9, and flowing said inert gas through said furnace at a flow rate of from about 5 to about 10 cubic feet per hour.

11. The process according to claim 10, and advancing said receptacle through said furnace to provide a process time of about 228 minutes.

12. The process according to claim 1, and adding silica to a given quantity of said material of nature in an amount which together with said given quantity provides a carbon to silicon ratio of from about 0.84:1 to about 2.17:1 for the total composition.

13. The process according to claim 12, wherein said additional silica in an amount providing a carbon to silicon ratio of from about 1.06:1 to about 1.26:1 for said total composition.

14. The process according to claim 12, wherein said additional silica in an amount providing a carbon to silicon ratio of 1.06:1 for said total composition.

15. The process according to claim 12, and reacting said material at a temperature of between about 1,800° C. and 2,100° C.

16. A process for making silicon carbide in crystal and whisker forms in yields greater than about 75% based on the conversion to silicon carbide of the total weight amount of silica and carbon in the reactants comprising the steps of:

selecting as one of the reactants a mined material of nature referred to herein as Black Diamond containing as essential ingredients carbon, silica, alumina, iron oxide and potassium oxide;

adding to said one of the reactants, as required, additional reactants selected from the group of carbon, silica and silicon carbide in amounts sufficient to provide a carbon to silicon ratio of about 0.84 to 1.57 based on the total weights of the reactants; and, reacting said material of nature and said additional reactants in an inert environment at a temperature of around 1800° C. to 2100° C.

17. The process according to claim 16, wherein said additional reactants include silica in an amount providing a carbon to silicon ratio of from about 0.84:1 to about 1.57:1 for said total composition.

18. The process according to claim 16, wherein said additional reactants includes silicon carbide in an amount of about 1% of the total weight of said total composition.

19. The process according to claim 18, wherein said additional reactants include silica in an amount providing a carbon to silicon ratio of from about 0.84:1 to about 1.26:1 for said total composition.

* * * * *